United States Patent
Shin et al.

(10) Patent No.: US 8,106,583 B2
(45) Date of Patent: Jan. 31, 2012

(54) ORGANIC LIGHT EMITTING DISPLAY APPARATUS

(75) Inventors: Dae-Bum Shin, Yongin (KR); Min-Chul Suh, Yongin (KR); Dong-Won Han, Yongin (KR); Dong-Kyu Lee, Yongin (KR); Jin-Ho Kwack, Yongin (KR); Dong-Hun Kang, Yongin (KR); Hyo-Jin Kim, Yongin (KR)

(73) Assignee: Samsung Mobile Display Co., Ltd., Nongseo-Dong, Giheung-Gu, Yongin, Gyunggi-Do (KR)

( * ) Notice: Subject to any disclaimer, the term of this patent is extended or adjusted under 35 U.S.C. 154(b) by 219 days.

(21) Appl. No.: 12/461,296

(22) Filed: Aug. 6, 2009

(65) Prior Publication Data

US 2010/0232162 A1   Sep. 16, 2010

(30) Foreign Application Priority Data

Mar. 11, 2009   (KR) .................. 10-2009-0020726

(51) Int. Cl.
*H01J 1/62*   (2006.01)
(52) U.S. Cl. ...................................... 313/506; 313/504
(58) Field of Classification Search .................. 313/504, 313/506, 509, 512
See application file for complete search history.

(56) References Cited

U.S. PATENT DOCUMENTS

| | | | |
|---|---|---|---|
| 6,911,772 B2 * | 6/2005 | Cok | 313/501 |
| 7,214,967 B2 * | 5/2007 | Park et al. | 257/91 |
| 7,339,315 B2 | 3/2008 | Suh et al. | |
| 7,348,207 B2 | 3/2008 | Kobayashi | |
| 7,554,259 B2 | 6/2009 | Matsusue | |

FOREIGN PATENT DOCUMENTS

| | | |
|---|---|---|
| JP | 08-262425 | 10/1996 |
| JP | 10-241574 | 9/1998 |
| JP | 2001-167874 | 6/2001 |
| JP | 2004247079 | 9/2004 |
| JP | 2005-100939 | 4/2005 |
| JP | 2005310746 A | 11/2005 |
| JP | 2007-035550 | 2/2007 |
| JP | 2007-200905 | 8/2007 |

OTHER PUBLICATIONS

Japanese Office Action issued by the Japanese Patent Office on Jun. 28, 2011 in the corresponding Japanese Patent Application No. 2010-041861.

* cited by examiner

*Primary Examiner* — Vip Patel
(74) *Attorney, Agent, or Firm* — Robert E. Bushnell, Esq.

(57) ABSTRACT

Provided is an organic light emitting display apparatus in which process efficiency and contrast are increased. The organic light emitting display apparatus includes a substrate, a display unit that is formed on the substrate and includes an organic light emitting device, an encapsulation layer that is formed on the display unit so as to encapsulate the display unit, a color filter layer that is formed on the encapsulation layer, a protection layer that is formed on the color filter layer, and a black matrix that is formed on the protection layer. The black matrix is aligned not to overlap the color filter layer.

13 Claims, 3 Drawing Sheets

ORGANIC LIGHT EMITTING DISPLAY APPARATUS

CLAIM OF PRIORITY

This application makes reference to, incorporates the same herein, and claims all benefits accruing under 35 U.S.C. §119 from an application earlier filed in the Korean Intellectual Property Office on 11 Mar. 2009 and there duly assigned Serial No. 10-2009-0020726.

BACKGROUND OF THE INVENTION

1. Field of the Invention

The present invention relates to an organic light emitting display apparatus, and more particularly, to an organic light emitting display apparatus in which process efficiency and contrast are increased.

2. Description of the Related Art

Recently, display apparatuses have been replaced by portable thin flat panel display apparatuses. An electroluminescent display apparatus, as one of the thin flat panel display apparatuses, is a self-emission display apparatus. The electroluminescent display apparatus has a wide view angle, excellent contrast, and quick response speed, and thus is noticed as a next generation display apparatus. Also, an organic light emitting display apparatus, in which a light emitting layer is formed of an organic material, has excellent luminance, driving voltage, and response speed as compared to an inorganic light emitting display apparatus, and displays multi-colors.

The organic light emitting display apparatus includes organic light emitting layers, each emitting red, green, and blue lights, so as to realize a visible ray in natural colors. However, the organic light emitting layers have different durability characteristics depending on color, and thus it is difficult to maintain white balance when the organic light emitting display apparatus is used for a long time.

Accordingly, an organic light emitting layer emitting light in a single color may be formed, and a color filter layer that extracts light corresponding to a predetermined color from the light emitted from the organic light emitting layer, or a color converting layer that converts the light emitted from the organic light emitting layer into light in a predetermined color may be formed in the organic light emitting display apparatus.

Meanwhile, in order to increase the contrast of the organic light emitting display apparatus, a black matrix (BM) may be formed to absorb a visible ray.

Contrast may be increased and white balance may be maintained by manufacturing an organic light emitting display apparatus including both of a color filter layer and a BM. However, since the color filter layer and the BM require a predetermined patterning, it is not easy to manufacture the organic light emitting display apparatus including both of the color filter layer and the BM, and thus manufacturing efficiency decreases. Accordingly, it is difficult to improve the characteristics of the organic light emitting display apparatus including both of the color filter layer and the BM.

SUMMARY OF THE INVENTION

The present invention provides an organic light emitting display apparatus in which process efficiency and contrast are increased.

According to an aspect of the present invention, there is provided an organic light emitting display apparatus including: a substrate, a display unit that is formed on the substrate and includes an organic light emitting device for emitting light, an encapsulation layer that is formed on the display unit so as to encapsulate the display unit, a color filter layer that is formed on the encapsulation layer, a protection layer that is formed on the color filter layer, and a black matrix that is formed on the protection layer.

The protection layer may be formed to cover the color filter layer.

The protection layer may include an inorganic material.

The protection layer may include calcium oxide, alumina, silica, titania, indium oxide, tin oxide, silicon oxide, silicon nitride, aluminum nitride, or combination thereof.

The organic light emitting display apparatus may further include a cover layer that is formed on the black matrix.

The cover layer may be formed to cover the black matrix and the protection layer.

The cover layer may include an inorganic material.

The cover layer may include calcium oxide, alumina, silica, titania, indium oxide, tin oxide, silicon oxide, silicon nitride, aluminum nitride, or combinations thereof.

The black matrix may be aligned not to overlap with the color filter layer.

The color filter layer may include a first color filter, a second color filter, and a third color filter. The black matrix may be aligned not to overlap with each of the first color filter, the second color filter, and the third color filter.

The organic light emitting unit may include a first intermediate layer, a second intermediate layer, and a third intermediate layer for emitting light.

Each of the first intermediate layer, the second intermediate layer, and the third intermediate layer may emit light with the same color.

The first color filer, the second color filter, and the third color filter may have different colors from each other.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, the present invention will be described more fully with reference to the accompanying drawings, in which exemplary embodiments of the invention are shown.

Figure 1:
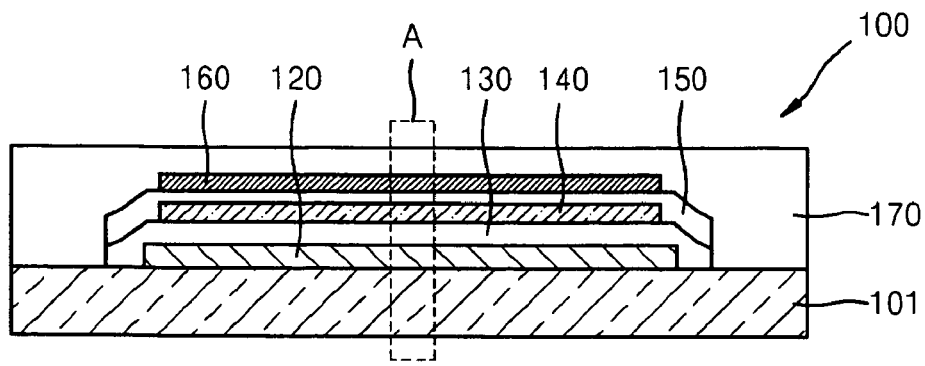
FIG. 1 is a cross-sectional view schematically illustrating an organic light emitting display apparatus according to an embodiment of the present invention.
Figure 2:
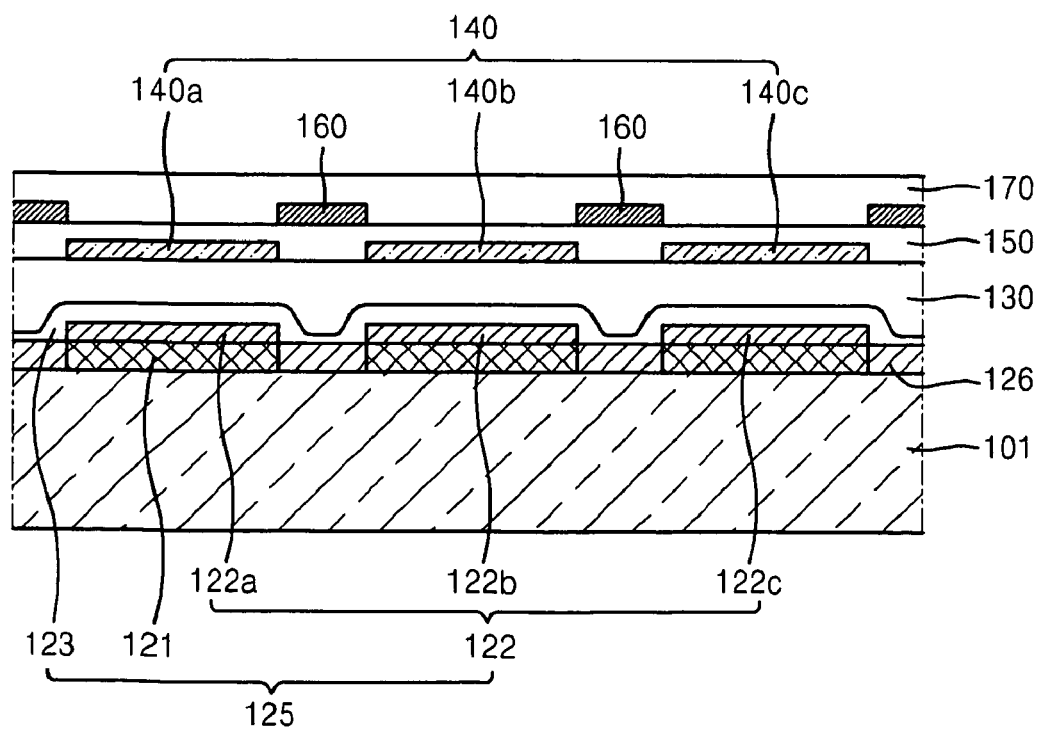
FIG. 2 is an enlarged diagram of an area A of FIG. 1.

FIG. 1 is a cross-sectional view schematically illustrating an organic light emitting display apparatus 1.00 according to an embodiment of the present invention, and FIG. 2 is an enlarged diagram of an area A of FIG. 1. In detail, FIGS. 1 and 2 shows the organic light emitting display apparatus 100 as a passive matrix (PM) type.

The organic light emitting display apparatus 100 includes a substrate 101, a display unit 120, an encapsulation layer 130, a color filter layer 140, a protection layer 150, at least one black matrix 160, and a cover layer 170.

The substrate 101 may be formed of a transparent glass material containing $SiO_2$ as a main component. However, a material of the substrate 101 is not limited thereto, and the substrate 101 may also be formed of a transparent plastic material. When the substrate 101 is formed of a plastic, the substrate 101 may include an organic material selected from the group consisting of polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, polycarbonate (PC), triacetyl cellulose (TAC), and cellulose acetate propionate (CAP).

When the organic light emitting display apparatus 100 is a bottom-emission type where an image is realized on the substrate 101, the substrate 101 must be formed of a transparent material. However, when the organic light emitting display apparatus 100 is a top-emission type where an image is realized on a side opposite to the substrate 101, the substrate 101 does not have to be formed of a transparent material. In this case, the substrate 101 may be formed of a metal. When the substrate 101 is formed of a metal, the substrate 101 may include at least one selected from the group consisting of carbon, iron, chromium, manganese, nickel, titanium, molybdenum, stainless steel (SUS), an Invar alloy, an Inconel alloy, and a Kovar alloy, however is not limited thereto. Alternatively, the substrate 101 may be formed of a metal foil.

The display unit 120 is formed on the substrate 101. The display unit 120 includes at least one organic light emitting device 125 that realizes an image. FIG. 2 is the enlarged diagram of the area A of FIG. 1, and illustrates the display unit 120 in detail. The display unit 120 includes the at least one organic light emitting device 125 that includes a first electrode 121, an intermediate layer 122, and a second electrode 123.

The first electrode 121, which is an anode, is formed on the substrate 101. The first electrode 121 may be formed in a predetermined pattern via a photolithography method, or the like. The first electrode 121 may be a transparent electrode or a reflective electrode. When the first electrode 121 is formed of a transparent material, the first electrode 121 may be formed of Indium Tin Oxide (ITO), Indium Zinc Oxide (IZO), Zinc Oxide (ZnO), or Indium Oxide ($In_2O_3$). When the first electrode 121 is a reflective electrode, the first electrode 121 may be formed by forming a reflective layer of Ag, Mg, Al, Pt, Pd, Au, Ni, Nd, Ir, Cr, or a compound thereof, and then forming a layer of ITO, IZO, ZnO, or $In_2O_3$ on the reflective layer.

Here, the first electrode 121 is an anode, however the first electrode 121 may also be a cathode. When the first electrode 121 is a cathode, the first electrode 121 may be formed of a metal having a low work function, such as Ag, Mg, Al, Pt, Pd, Au, Ni, Nd, Ir, Cr, Li, Ca, or a compound thereof. An insulating layer 126 is disposed between the first electrodes 121.

The intermediate layer 122 is formed on the first electrode 121. The intermediate layer 122 includes an organic light emitting layer (not shown). The intermediate layer 122 also includes a first intermediate layer 122a, a second intermediate layer 122b, and a third intermediate layer 122c. The first through third intermediate layers 122a through 122c may include an organic light emitting layer that emits a visible ray of the same color. For example, the intermediate layer 122 may be an organic light emitting layer that emits a white or blue visible ray.

However, the present embodiment is not limited thereto. In other words, the first through third intermediate layers 122a through 122c may include organic light emitting layers that emit various colors correspondingly to a color filter layer 140 that will be described later.

The intermediate layer 122 may be formed of various organic materials. When the organic light emitting layer of the intermediate layer 122 is formed of a low molecular organic material, the intermediate layer 122 is formed in such a way that a hole transport layer (HTL) and a hole injection layer (HIL) are stacked in a direction of the first electrode 121 based on the organic light emitting layer, and an electron transport layer (ETL) and an electron injection layer (EIL) are stacked in a direction of the second electrode 123 based on the organic light emitting layer. In addition, the intermediate layer 122 may include various layers if required. Examples of the organic material used to form the intermediate layer 122 include copper phthalocyanine CuPc, N,N'-Di(naphthalene-1-yl)-N,N'-diphenyl-benzidine (NPB), and tris-8-hydroxyquinoline aluminum (Alq3).

Meanwhile, when the organic light emitting layer of the intermediate layer 122 is formed of a polymer organic material, the intermediate layer 122 may only include the HTL in the direction of the first electrode 121 based on the organic light emitting layer. Such a polymer HTL is formed on the first electrode 121 via an inkjet printing or spin coating method by using poly-(2,4)-ethylene-dihydroxy thiophene (PEDOT) or polyaniline (PANI). The polymer organic light emitting layer may be formed of PPV, soluble PPVs, cyano-PPV, or polyfluorene, and a color pattern may be formed via an inkjet printing or spin coating method, or a conventional method such as a thermal transfer type method using a laser.

The second electrode 123 is formed on the intermediate layer 122, and crosses the first electrode 121. The second electrode 123 may be a transparent electrode or a reflective electrode. When the second electrode 123 is a transparent electrode, the second electrode 123 may be formed by depositing Li, Ca, LiF/Ca, LiF/Al, Al, Mg, or a compound thereof toward the intermediate layer 122, and then forming an auxiliary electrode or a bus electrode line thereon by using a transparent conductive material, such as ITO, IZO, ZnO, or $In_2O_3$. When the second electrode 123 is a reflective electrode, the second electrode 123 may be formed by depositing Li, Ca, LiF/Ca, LiF/Al, Al, Mg, or a compound thereof on the intermediate layer 122. Hereinbefore, the second electrode 123 is a cathode.

When the second electrode 123 is an anode, the second electrode 123 may be formed of a transparent conductive material having a high work function, such as ITO, IZO, ZnO, or $In_2O_3$.

When a voltage is applied to the first and second electrodes 121 and 123 of the organic light emitting device 125, the organic light emitting layer of the intermediate layer 122 emits a visible ray.

The intersection portion of the first electrode 121 and the second electrode 123 defines a pixel. As shown in FIG. 2, there may be a plurality of first electrodes 121, on which the first intermediate layer 122a, the second intermediate layer 122b, and the third intermediate layer 122c are disposed respectively.

The encapsulation layer 130 is formed on the second electrode 123. The encapsulation layer 130 protects the organic light emitting device 125 from external oxygen or moisture, and may be formed by using an organic material or an inorganic material, or by stacking an organic material and an inorganic material.

Here, since the encapsulation layer 130 is formed by stacking an organic material and an inorganic material, the encapsulation layer 130 may be thin. The thickness of the encapsulation layer 130 may be 0.3 µm or less, so as to easily manufacture the thin organic light emitting display apparatus 100.

Various types of inorganic materials may be used to form the encapsulation layer 130, and in detail, the encapsulation layer 130 may include calcium oxide, alumina, silica, titania, indium oxide, tin oxide, silicon oxide, silicon nitride, or aluminum nitride. Such inorganic materials prevent external moisture or oxygen from penetrating into the organic light emitting device 125.

Also, various types of organic materials may be used to form the encapsulation layer 130. In detail, examples of the organic materials include photo acrylic organic material or SiOC. Since the organic material covers minute particles, the encapsulation layer 130 that has an even surface may be easily formed.

The encapsulation layer 130 may have a single layer of an inorganic material, a single layer of an organic material, a plurality of layers of an organic material, a plurality of layers of an inorganic material, or a stacked structure of organic and inorganic materials.

The color filter layer 140 is formed on the encapsulation layer 130. The color filter layer 140 includes a first color filter 140a, a second color filter 140b, and a third color filter 140c. The color filter layer 140 is formed correspondingly aligned to the first electrode 121 below the color filter layer 140. In other words, the first color filter 140a, the second color filter 140b, and the third color filter 140c are aligned to the first intermediate layer 122a, the second intermediate layer 122b, and the third intermediate layer 122c, respectively.

The first through third color filters 140a through 140c realize different colors. For example, the first color filter 140a may be a red color filter layer, the second color filter 140b may be a green color filter layer, and the third color filter 140c may be a blue color filter layer.

The color filter layer 140 may be formed via various methods. In detail, the color filter layer 140 may be easily formed without affecting the encapsulation layer 130 and the organic light emitting device 125 below the color filter layer 140, by using a laser thermal transfer method.

The protection layer 150 is formed on the color filter layer 140 and the encapsulation layer 130 so as to cover the color filter layer 140. The protection layer 150 may include an inorganic material. In detail, the protection layer 150 includes calcium oxide, alumina, silica, titania, indium oxide, tin oxide, silicon oxide, silicon nitride, or aluminum nitride.

The black matrix 160 is formed on the protection layer 150. The black matrix 160 has a predetermined pattern, and is formed correspondingly to a non-light emitting portion of the organic light emitting device 125. In other words, the black matrix 160 is aligned not to overlap with each of the first color filter 140a, the second color filter 140b, and the third color filter 140c. However, depending on design, edge portion of the black matrix 160 may overlap with edge portions of the first color filter 140a, the second color filter 140b, and the third color filter 140c. The black matrix 160 increases the contrast of the organic light emitting display apparatus 100 by absorbing an external visible ray and preventing color mixture and interference of a visible ray from the color filter layer 140.

The black matrix 160 is formed by coating a black material on the protection layer 150 and then performing a photolithography method or the like, so that the black matrix 160 has a predetermined pattern. Here, the color filter layer 140 below the black matrix 160 may be damaged. Specifically, when the black matrix 160 and the color filter layer 140 are attached to each other, the color filter layer 140 may be damaged while patterning the black matrix 160, or the black matrix 160 may not be completely patterned.

However, in the organic light emitting display apparatus 100 according to the current embodiment of the present invention, the protection layer 150 is disposed between the color filter layer 140 and the black matrix 160. The protection layer 150 covers the color filter layer 140, and thus the color filter layer 140 and the black matrix 160 are spaced apart from each other. Accordingly, the color filter layer 140 is prevented from being damaged while patterning the black matrix 160. Also, a patterning characteristic of the black matrix 160 is increased by preventing the black matrix 160 from being attached to the color filter layer 140.

Specifically, when the protection layer 150 includes an inorganic material, the protection layer 150 does not react with a developer during a developing process of the black matrix 160 while patterning the black matrix 160. Accordingly, the protection layer 150 is not damaged by the developer and an adhesive strength between the protection layer 150 and the black matrix 160 does not decrease, and thus the black matrix 160 is easily patterned.

Then, the cover layer 170 may be formed on the black matrix 160. The cover layer 170 covers the black matrix 160 and the protection layer 150, and contacts the substrate 101. Specifically, the cover layer 170 may be larger than the encapsulation layer 130, and formed correspondingly to a boundary area of the substrate 101. Accordingly, the cover layer 170 protects the black matrix 160 and the color filter layer 140.

The cover layer 170 includes an inorganic material. In detail, the cover layer 170 includes calcium oxide, alumina, silica, titania, indium oxide, tin oxide, silicon oxide, silicon nitride, or aluminum nitride.

Figure 3:
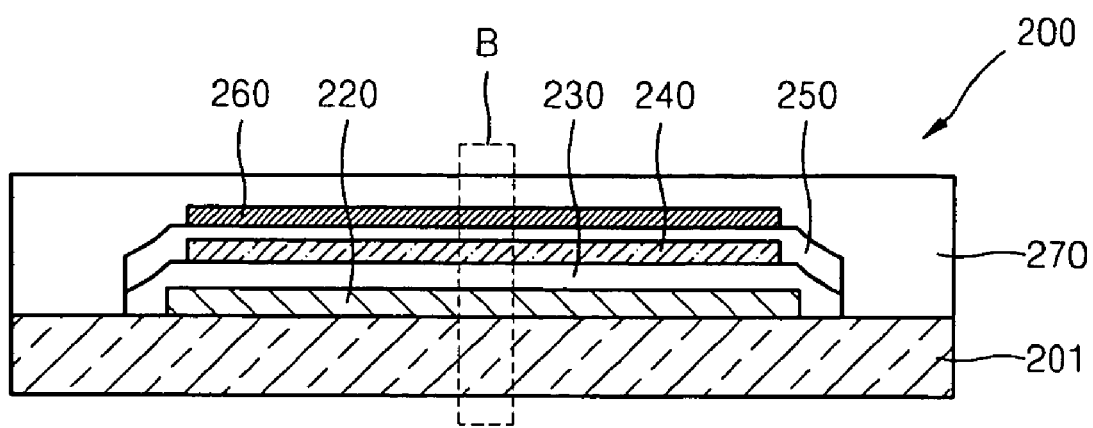
FIG. 3 is a cross-sectional view schematically illustrating an organic light emitting display apparatus according to another embodiment of the present invention.
Figure 4:
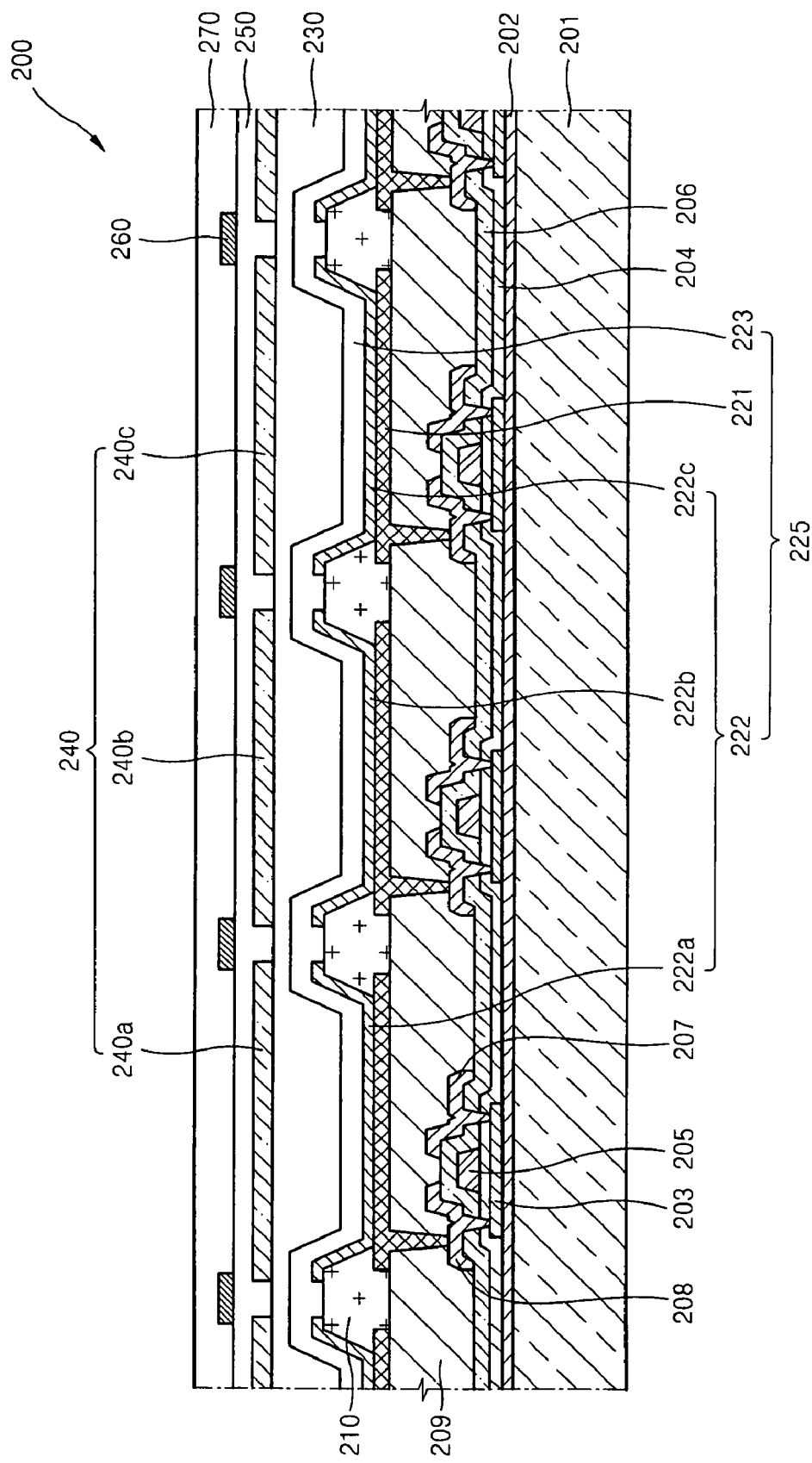
FIG. 4 is an enlarged diagram of an area B of FIG. 3.

FIG. 3 is a cross-sectional view schematically illustrating an organic light emitting display apparatus 200 according to another embodiment of the present invention, and FIG. 4 is an enlarged diagram of an area B of FIG. 3. In detail, FIGS. 3 and 4 illustrate the organic light emitting display apparatus 200 as an active matrix (AM) type.

Referring to FIGS. 3 and 4, a thin film transistor (TFT) on a substrate 201, and an organic light emitting device 225 connected to the TFT are illustrated. The TFT includes an active layer 203, a gate electrode 205, a source electrode 207, and a drain electrode 208. The TFT will now be described in detail.

A buffer layer 202 is formed on a top surface of the substrate 201 so as to flatten the top surface of the substrate 201 and prevent impurities from penetrating into the substrate 201. The buffer layer 202 may be formed of $SiO_2$ and/or SiNx.

The active layer 203 having a predetermined pattern is formed on the buffer layer 202. The active layer 203 may be formed of an inorganic semiconductor such as amorphous silicon or poly silicon, or an organic semiconductor, and includes a source area, a drain area, and a channel area.

A gate insulation layer 204 is formed on the active layer 203. The gate insulation layer 204 may be formed of an inorganic material such as metal oxide or metal nitride, or an organic material such as insulative polymer. Alternatively, the gate insulation layer 204 may be formed of $SiO_2$ or SiNx.

The gate electrode 205 is formed on a predetermined area on the gate insulation layer 204. The gate electrode 205 is connected to a gate line (not shown) that applies an on/off signal to the TFT. The gate electrode 205 may be formed of a metal such as Au, Ag, Cu, Ni, Pt, Pd, Al, Mo, an Al:Nd alloy, or a Mo:W alloy, or a metal alloy, however is not limited thereto.

An intermediate insulation layer 206 is formed on the gate electrode 205, and the source electrode 207 and the drain electrode 208 are formed to respectively contact the source area and the drain area of the active layer 203 via a contact hole. The TFT formed as described above protects an insulation layer 209 by covering the insulation layer 209.

The insulation layer 209 may be formed by using an inorganic material and/or an organic material. The inorganic material may be $SiO_2$, $SiN_x$, $SiON$, $Al_2O_3$, $TiO_2$, $Ta_2O_5$, $HfO_2$, $ZrO_2$, BST, or PZT, and the organic material may be polymer that is generally commercialized such as polymethyl-metacrylate (PMMA) or polystryrene (PS), a polymer derivative having a phenol group, an acrylic polymer, an imide-based polymer, an aryl ether-based polymer, an amide-based polymer, a fluorine-based polymer, a p-xylene-based polymer, a vinyl alcohol-based polymer, and a blend thereof. The insulation layer 209 may have a complex stacked structure of an inorganic insulation layer and an organic insulation layer.

A first electrode 221, which is an anode of the organic light emitting device 225, is formed on the insulation layer 209. There may be a plurality of first electrodes 221, and each of the first electrodes 221 is formed correspondingly to each pixel via a photolithography method.

A pixel-defining layer 210 formed of an insulation material is formed to cover the first electrode 221. After forming a predetermined opening in the pixel-defining layer 210, an intermediate layer 222 is formed in a limited area via the opening.

The intermediate layer 222 includes an organic light emitting layer. The intermediate layer 222 includes a first intermediate layer 222a, a second intermediate layer 222b, and a third intermediate layer 222c. The first through third intermediate layers 222a through 222c may include an organic light emitting layer emitting the same visible ray. For example, the intermediate layer 122 may be a white or blue organic light emitting layer.

However, the current embodiment is not limited thereto. In other words, the first through third intermediate layers 222a through 222c may include organic light emitting layers emitting various colors correspondingly to a color filter layer 240 that will be described later.

Then, a second electrode 223, which is a cathode of the organic light emitting device 225, is formed to cover all pixels. Here, the polarities of the first electrode 221 and the second electrode 223 may change.

Materials for forming the first and second electrodes 221 and 223 are identical to the previous embodiment, and thus details thereof are not repeated.

An encapsulation layer 230 is formed on the second electrode 223. The encapsulation layer 230 prevents the organic light emitting device 225 from external oxygen or moisture, and may be formed by using an organic material or an inorganic material, or by stacking the organic material and the inorganic material.

The inorganic material for forming the encapsulation layer 230 may be various. In detail, the encapsulation layer 230 may include calcium oxide, alumina, silica, titania, indium oxide, tin oxide, silicon oxide, silicon nitride, or aluminum nitride.

Also, the organic material for forming the encapsulation layer 230 may be various. In detail, the organic material may include a photo acrylic organic material of SiOC.

The encapsulation layer 230 may be a single layer of an organic material, a single layer of an inorganic material, a plurality of organic materials, a plurality of inorganic materials, or a stacked structure of organic and inorganic materials.

The color filter layer 240 is formed on the encapsulation layer 230. The color filter layer 240 includes a first color filter 240a, a second color filter 240b, and a third color filter 240c. The color filter layer 240 is formed correspondingly to the first electrode 221 below the color filter layer 240.

The first through third color filters 240a through 240c realize different colors. For example, the first color filter 240a may be a red color filter layer, the second color filter 240b may be a green color filter layer, and the third color filter 240c may be a blue color filter layer.

The color filter layer 240 may be formed via various methods. For example, the color filter layer 240 may be patterned via a photolithography method.

A protection layer 250 is formed on the color filter layer 240 to cover the color filter layer 240. The protection layer 250 includes an inorganic material. In detail, the protection layer 250 includes calcium oxide, alumina, silica, titania, indium oxide, tin oxide, silicon oxide, silicon nitride, or aluminum nitride.

A black matrix 260 is formed on the protection layer 250. The black matrix 260 has a predetermined pattern, and is formed correspondingly to a non-light emitting area of the organic light emitting device 225. The black matrix 260 increases the contrast of the organic light emitting display apparatus 200 by absorbing an external visible ray and preventing color mixture and interference of a visible ray from the color filter layer 240.

The black matrix 260 is formed by coating a black material and then performing a photolithography method or the like, so that the black matrix 160 has a predetermined pattern. Here, the color filter layer 240 below the black matrix 260 may be damaged. Specifically, when the black matrix 260 and the color filter layer 240 are attached to each other, the color filter layer 240 may be damaged while patterning the black matrix 260, or the black matrix 260 may not be completely patterned.

However, in the organic light emitting display apparatus 200 according to the current embodiment of the present invention, the protection layer 250 is disposed between the color filter layer 240 and the black matrix 260. The protection layer 250 covers the color filter layer 240, and thus the color filter layer 240 and the black matrix 260 are spaced apart from each other. Accordingly, the color filter layer 240 is prevented from being damaged while patterning the black matrix 260. Also, a patterning characteristic of the black matrix 260 is increased by preventing the black matrix 260 from being attached to the color filter layer 240.

Specifically, since the protection layer 250 includes an inorganic material, the protection layer 250 is not damaged and the black matrix 260 is easily patterned when patterning the black matrix 260.

A cover layer 270 is formed on the black matrix 260. The cover layer 270 is formed to cover the black matrix 260 and the protection layer 250. The cover layer 270 may have a size that is equal to or larger than the encapsulation layer 230. The cover layer 270 protects the black matrix 260 and the color filter layer 240.

The cover layer 270 includes an inorganic material. In detail, the cover layer 270 includes calcium oxide, alumina, silica, titania, indium oxide, tin oxide, silicon oxide, silicon nitride, or aluminum nitride.

The AM type organic light emitting display apparatus 200 having a top gate structure has been described above, however the present invention is not limited thereto, and may be applied to an organic light emitting display apparatus having various shapes. Specifically, the present invention may be applied to a display apparatus having a flexible structure, a bendable structure, or a very thin film structure.

According to an organic light emitting display apparatus according to the present invention, process efficiency and contrast of the organic light emitting display apparatus are increased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display apparatus comprising:
    a substrate;
    a display unit formed on the substrate, the display unit comprising an organic light emitting device for emitting light;
    an encapsulation layer formed on the display unit so as to encapsulate the display unit;
    a color filter layer formed on the encapsulation layer;
    a protection layer formed on the color filter layer; and
    a black matrix formed on the protection layer.

2. The organic light emitting display apparatus of claim 1, wherein the protection layer is formed to cover the color filter layer.

3. The organic light emitting display apparatus of claim 1, wherein the protection layer is made of a material including an inorganic material.

4. The organic light emitting display apparatus of claim 1, wherein the protection layer is made of a material including one material selected from the group consisting of calcium oxide, alumina, silica, titania, indium oxide, tin oxide, silicon oxide, silicon nitride, aluminum nitride, and combinations thereof.

5. The organic light emitting display apparatus of claim 1, further comprising a cover layer formed on the black matrix.

6. The organic light emitting display apparatus of claim 5, wherein the cover layer is formed to cover the black matrix and the protection layer.

7. The organic light emitting display apparatus of claim 5, wherein the cover layer is made of a material including an inorganic material.

8. The organic light emitting display apparatus of claim 5, wherein the cover layer is made of a material including one material selected from the group consisting of calcium oxide, alumina, silica, titania, indium oxide, tin oxide, silicon oxide, silicon nitride, aluminum nitride, and combinations thereof.

9. The organic light emitting display apparatus of claim 1, wherein the black matrix is aligned not to overlap with the color filter layer.

10. The organic light emitting display apparatus of claim 1, wherein the color filter layer comprising a first color filter, a second color filter, and a third color filter, the black matrix is aligned not to overlap with each of the first color filter, the second color filter, and the third color filter.

11. The organic light emitting display apparatus of claim 1, wherein the display unit comprises a first intermediate layer, a second intermediate layer, and a third intermediate layer for emitting light.

12. The organic light emitting display apparatus of claim 11, wherein each of the first intermediate layer, the second intermediate layer, and the third intermediate layer emits light with the same color.

13. The organic light emitting display apparatus of claim 12, wherein the color filter comprising:
    a first color filter disposed to overlap with the first intermediate layer;
    a second color filter disposed to overlap with the second intermediate layer; and
    a third color filter disposed to overlap with the third intermediate layer, the first color filer, the second color filter, and the third color filter having different colors from each other.

* * * * *